United States Patent
Walker

(10) Patent No.: US 7,459,755 B2
(45) Date of Patent: Dec. 2, 2008

(54) DUAL-GATE SEMICONDUCTOR DEVICES WITH ENHANCED SCALABILITY

(76) Inventor: Andrew J. Walker, 1638 Cornell Dr., Mountain View, CA (US) 94040

( * ) Notice: Subject to any disclaimer, the term of this patent is extended or adjusted under 35 U.S.C. 154(b) by 55 days.

(21) Appl. No.: 11/441,567

(22) Filed: May 25, 2006

(65) Prior Publication Data

US 2007/0284621 A1    Dec. 13, 2007

(51) Int. Cl.
    *H01L 23/62*    (2006.01)
(52) U.S. Cl. .................. 257/365; 257/366; 257/576; 438/211
(58) Field of Classification Search .............. 257/57, 257/66, 319, 347, 365, 366, E29.273–E29.275; 438/211, 213
    See application file for complete search history.

(56) References Cited

U.S. PATENT DOCUMENTS

| 5,124,769 A * | 6/1992 | Tanaka et al. ............... 257/66 |
| 2003/0075755 A1* | 4/2003 | Yamazaki ................... 257/315 |

\* cited by examiner

*Primary Examiner*—M. Wilczewski
*Assistant Examiner*—Paul E Patton
(74) *Attorney, Agent, or Firm*—Edward C. Kwok; MacPherson Kwok Chen & Heid LLP

(57) ABSTRACT

A scalable semiconductor device is formed using control gates formed on opposite sides of a semiconductor layer. A first control gate is formed electrically isolated from a first surface of the semiconductor layer by a first dielectric layer, such that, when a first voltage is applied on the first control gate, a first depletion region is formed in the semiconductor layer opposite the first control gate. A second control gate and a third control gate are also formed, each isolated from the semiconductor region by a second dielectric layer formed on a second surface of the semiconductor layer opposite the first surface. The second and the third control gates are offset from the first control gate such that, when a second voltage is applied to the second and third control gates, depletion regions are formed opposite the second and third control gates, respectively, such that each of the depletion regions opposite the second and third control gates overlaps the first depletion region to serve as source and drain regions, when filled with mobile carriers, of a field-effect transistor to the first depletion region, which serves as a channel region of the field-effect transistor.

22 Claims, 5 Drawing Sheets ent invention is better understood upon consider-
DUAL-GATE SEMICONDUCTOR DEVICES WITH ENHANCED SCALABILITY

BACKGROUND OF THE INVENTION

1. Field of the Invention

The present invention relates to design of closely spaced semiconductor devices. In particular, the present invention relates to design of closely spaced dual-gate semiconductor devices useful, for example, in non-volatile memory applications.

2. Discussion of the Related Art

As the dimensions of semiconductor devices continue to diminish, dopant diffusion has become a serious hurdle to proportionally scale existing devices to take advantage of the smaller dimensions. One example of the dopant diffusion problem is illustrated, for example, by conventional NMOS field effect transistor (FET) 100 of FIG. 1. In FIG. 1, NMOS FET 100 is formed on a monocrystalline semiconductor substrate 101. Typically, after dielectric layer ("gate dielectric layer") 102 and gate electrode 103 are formed, using conventional deposition, photolithographical and etching techniques, N-type dopants (e.g., phosphorus or arsenic) are introduced (e.g., by ion implantation) into exposed areas 104a and 104b of substrate 101, self-aligned to gate electrode structure 103 to form a source region and a drain region. The region at the surface of semiconductor substrate 101 protected by gate electrode 103 forms a channel region which, during operation, selectably provides a conductive path between source and drain regions 104a and 104b when a suitable voltage relative to source region 104a is imposed on gate electrode structure 103. Thermal steps in the manufacturing process subsequent to the step introducing dopants into source and drain regions 104a and 104b cause the dopants to diffuse laterally under gate electrode 103, as indicated in FIG. 1. The dopant diffusion has the effect of shortening the length of the channel region ("channel length"). However, so long as source and drain regions 104a and 104b remain separated by a minimum distance, the resulting structure is able to operate as an NMOS FET.

As the dimensions of semiconductor devices continue to diminish, the length of the channel region before dopant diffusion diminishes proportionally, bringing the implanted source and drain regions 104a and 104b closer together. However, without a change in the subsequent thermal steps, the shortening resulting from dopant diffusion is not changed, so that the channel length of the transistor may become unacceptably short for proper device operation.

FIG. 2 shows another example in which dopant diffusion affects device scaling. FIG. 2 shows memory transistors 200a-200d in a NAND "flash" string structure. As shown in FIG. 2, memory transistors 200a-200d include control and floating gate electrodes 201a-201d and source and drain regions 202a-202e, which may be created by implanting dopant ions into in monocrystalline semiconductor substrate 204. Control and floating gate electrodes 201a-201d are formed over a thin tunnel oxide layer 203 (represented by tunnel oxide structures 203a-203d), each including a floating gate electrode and a control gate electrode separated by an dielectric layer between the polysilicon layers forming the floating and control electrodes. The charge stored in the floating gate electrode controls the conductivity type in the channel region formed on the surface of semiconductor substrate 201 under the floating gate electrode. The control gate electrode controls storing or removing the charge stored in its associated floating gate electrode. Memory transistors 200a-200d of FIG. 2 are difficult to scale because of dopant diffusion into the channel regions, in a manner substantially similar to the dopant diffusion problem discussed above with respect to NMOS FET 100 of FIG. 1.

The dopant diffusion problem is even more acute in thin film transistors (TFTs) where the channel, source and drain regions are formed in a polycrystalline material (e.g., polysilicon or amorphous material, such as amorphous silicon) in which dopant diffusion is many times enhanced compared to material such as the monocrystalline silicon substrates of FIGS. 1 and 2.

Accordingly, there is a need for overcoming scaling limitations caused by dopant diffusion in devices having the smaller device dimensions achieved today.

SUMMARY

The present invention provides a method and a scalable semiconductor device, which is formed using control gates formed on opposite sides of a semiconductor layer (e.g., polysilicon or amorphous silicon). According to one embodiment of the present invention, a first control gate is formed electrically isolated from a first surface of the semiconductor layer by a first dielectric layer, such that, when a first voltage is applied on the first control gate, a first inversion region is formed in the semiconductor layer opposite the first control gate. A second control gate and a third control gate are also formed, each isolated from the semiconductor region by a second dielectric layer formed on a second surface of the semiconductor layer opposite the first surface. The second and the third control gates are offset from the first control gate such that, when a second voltage is applied to the second and third control gates, inversion layers are formed opposite the second and third control gates, respectively, such that each of the inversions layers opposite the second and third control gates overlaps the first inversion region. The first, second and third inversion regions thus form the channel, source region and drain regions of a field-effect transistor.

According to a second embodiment of the present invention, the semiconductor device may be used in a non-volatile memory structure, in which the first control gate is provided as a part of a non-volatile memory device. (The second control gate may also be provided as a part of a non-volatile memory device to achieve high memory capacity). The second and the third control gates are each one of a number of source/drain gates formed along the second surface of the semiconductor layer. These non-volatile memory devices and the source/drain gates may form a dual-gate type NAND flash string.

Because the source and drain regions in the semiconductor devices of the present invention are formed by inversion of a relatively uniformly doped semiconductor region, rather than by ion implantation followed by thermal steps, these semiconductor devices can be scaled to smaller dimensions independent of the dopant diffusion problem.

The present invention is better understood upon consideration of the detailed description below and the accompanying drawings.

Figure 4:
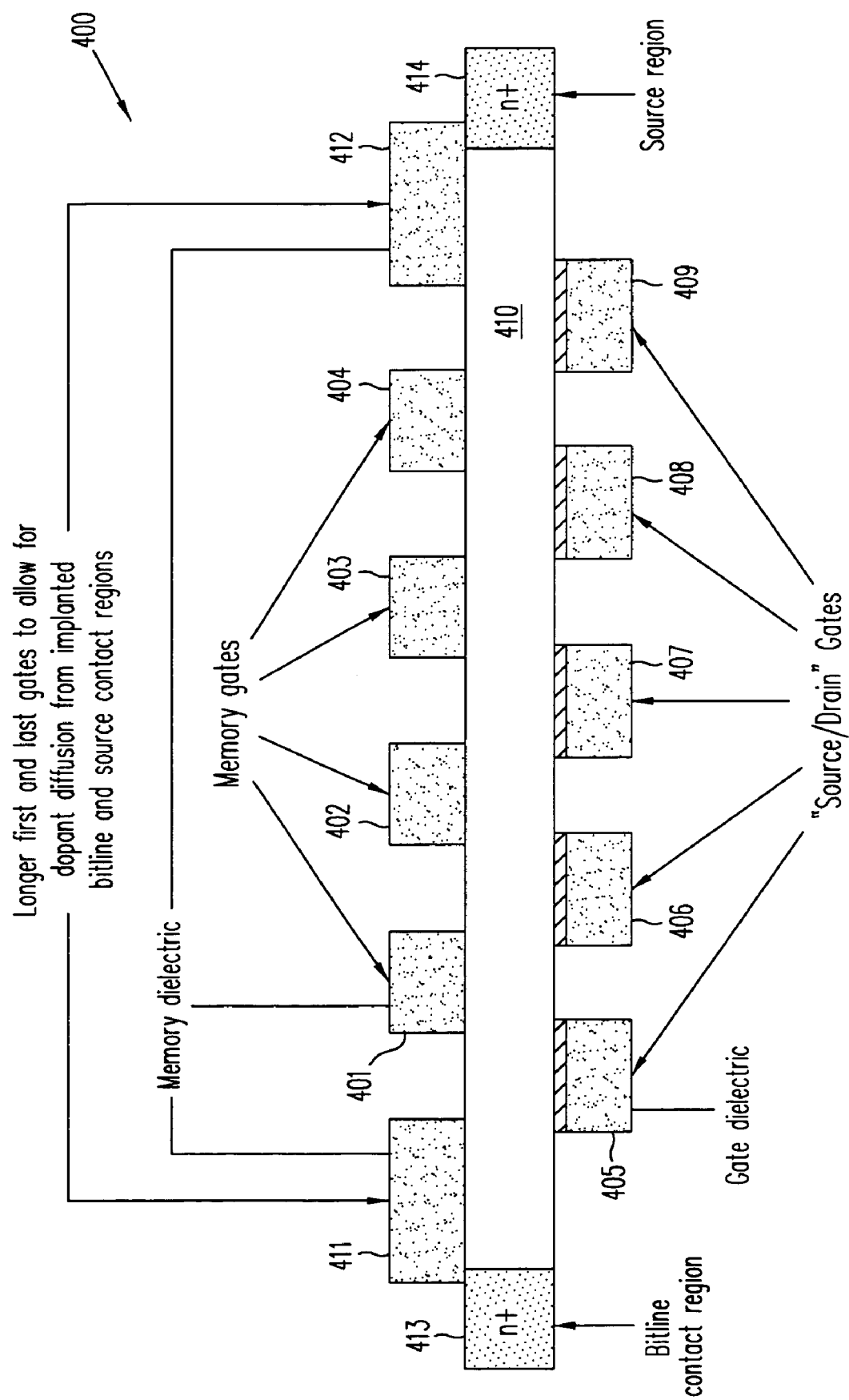

FIG. 4 shows 4-bit NAND flash string 400 formed out of thin-film transistors (TFTs) in which front gate devices 401-404 are the memory devices and the back gate devices 405-409 are used to form inversion regions to serve as source regions and drain regions, in accordance with one embodiment of the present invention.

Figure 5:
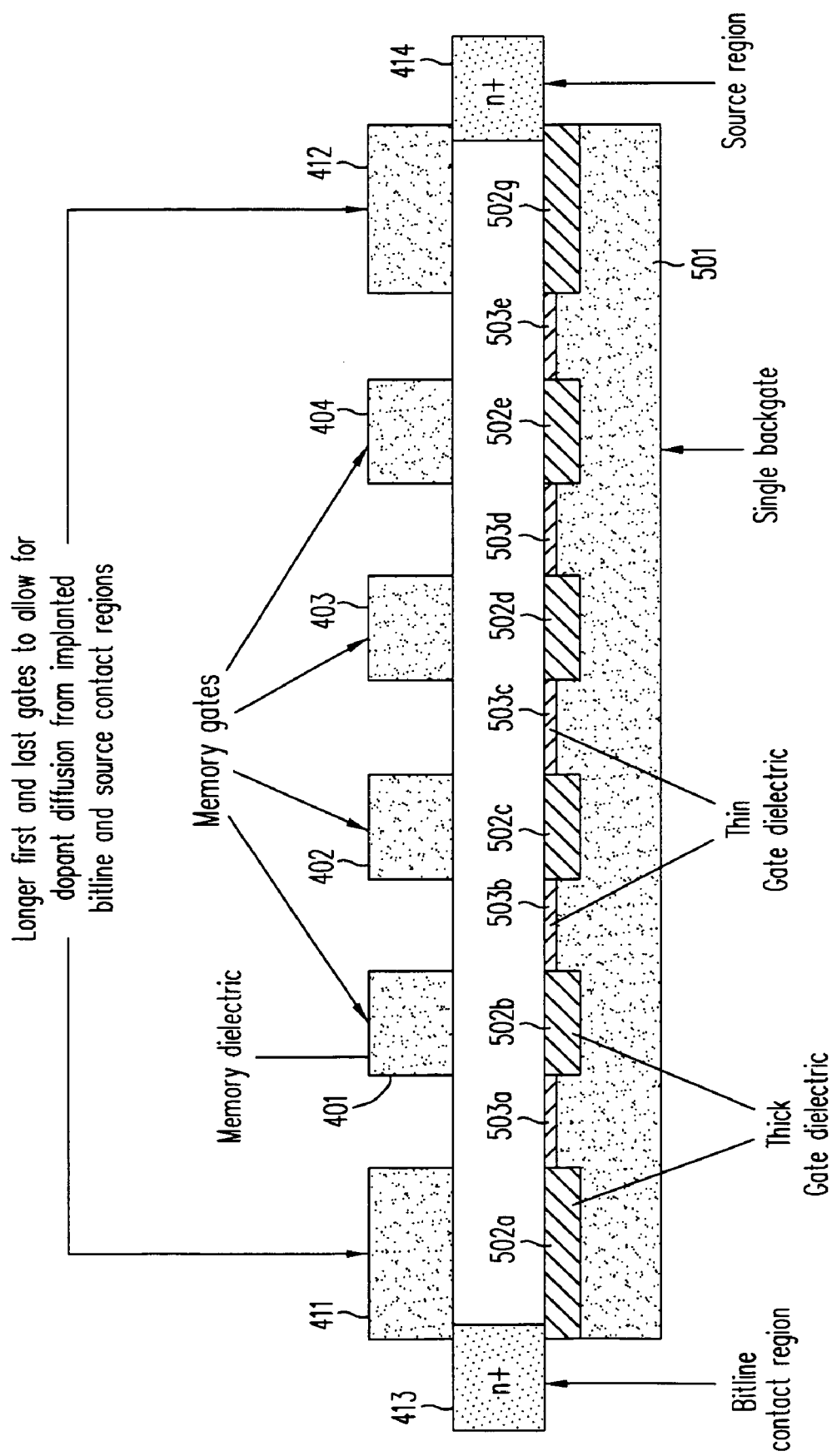

FIG. 5 shows 4-bit NAND flash string 500, structurally similar to 4-bit NAND flash string 400 of FIG. 4, except that the back gate devices 405-409 are replaced by common gate 501, in accordance with another embodiment of the present invention.

Figure 6:
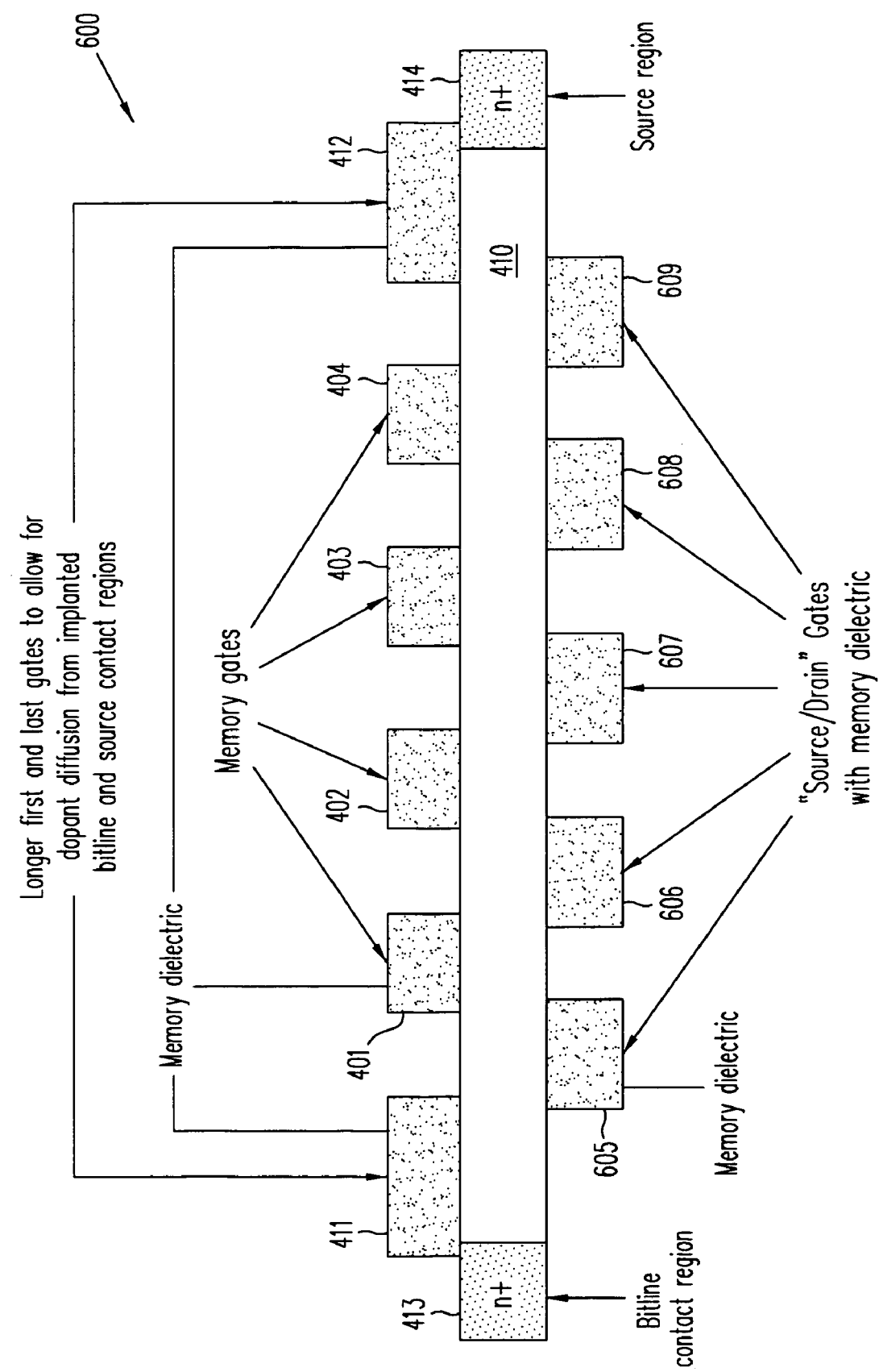

FIG. 6 shows 9-bit NAND flash string 600, in accordance with another embodiment of the present invention.

To facilitate cross-referencing among the figures, like features in these figures are labeled using like reference numerals.

DETAILED DESCRIPTION OF THE PREFERRED EMBODIMENTS

The present invention provides a structure in a dual-gate device and a method which obviate the need for forming permanent source and drain regions using conventional techniques, such as implanting dopants into a semiconductor substrate.

Figure 3:
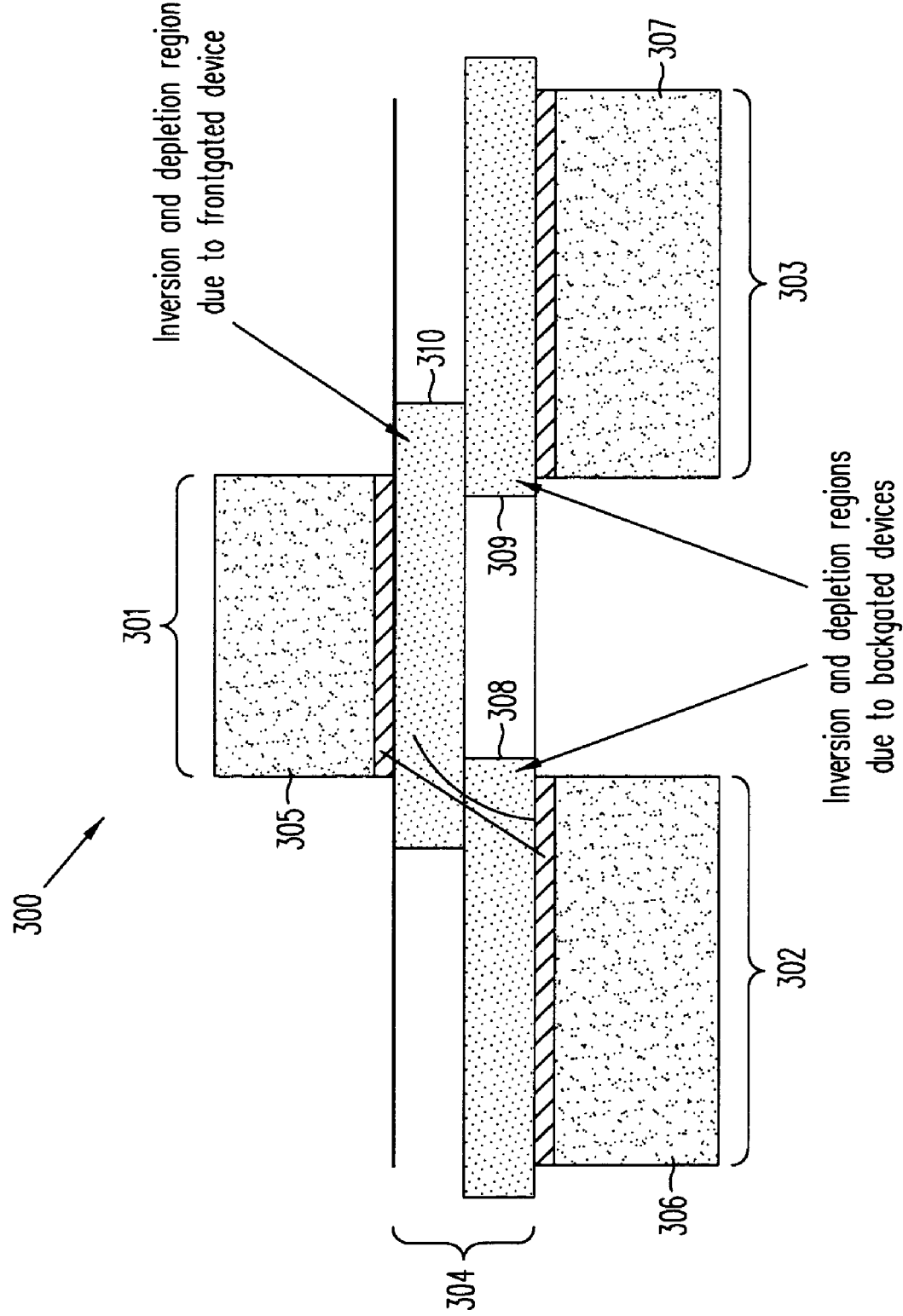
FIG. 3 shows dual-gate device 300 which includes "front gate" structure 301 and "back gate" structures 302 and 303 fabricated on opposite sides of a polycrystalline layer 304, in accordance with one embodiment of the present invention.

Dual-gate devices have been used in non-volatile memory and logic devices. Some examples of the design, manufacturing and operation of dual-gate devices are disclosed in copending U.S. patent application ("Copending Application"), entitled "Dual-gate Device and Method" by A, Walker, Ser. No. 11/197,462. The Copending Application is hereby incorporated by reference to provide background information. FIG. 3 shows dual-gate device 300 which includes "front gate" structure 301 and "back gate" structures 302 and 303 fabricated on opposite sides of a polycrystalline semiconductor layer 304. Polycrystalline semiconductor layer 304 may be a 300 Å thick layer formed out of polysilicon or amorphous silicon and may be lightly, uniformly doped by a P-type dopant (e.g., boron, at dopant concentration of $10^{15}$-$10^{18}$/cm$^3$). Alternatively, semiconductor layer 304 may be formed out of a silicon-germanium alloy or pure germanium. Alternatively, semiconductor layer 304 may also be any suitable material including close to single crystal material, which may be formed by various techniques (e.g., laser irradiation, electron-beam irradiation, germanium induced crystallization, metal-induced crystallization). In metal-induced crystallization, common metals are nickel, titanium and aluminum. Note that the terms "front gate" and "back gate" are merely convenient labels that refer to the relative positions of these thin film transistor devices (TFTs) to each other and to polycrystalline semiconductor layer 304. The labels could be exchanged without loss of generality. As shown in FIG. 3, structures 301, 302 and 303 each include a polysilicon control electrode (e.g., control electrode 305, 306 or 307) and a dielectric layer between the polysilicon control electrode and polycrystalline semiconductor layer 304. Alternatively, control electrodes 305, 306 and 307 may each be formed out metals or combinations of polysilicon and metals. Common metals used in this regard are tungsten, tungsten nitride, titanium nitride, titanium disilicide, tungsten silicide.

In dual-gate device 300, when a suitable voltage is imposed during operation on each of control electrodes 306 and 307 of back gate devices 302 and 303, a depletion region (e.g., depletion regions 308 or 309) is formed in polycrystalline semiconductor layer 304 opposite the corresponding control electrode. Therefore, when a suitable voltage is imposed on control electrode 305 of front gate device 301, the resulting depletion region 310 links up with depletion regions 308 and 309 to form a conducting path between depletion regions 308 and 309. If the voltages on control electrodes 306 and 307 are sufficiently high (i.e., higher than the threshold voltage of each device) and if there is a supply of electrons into the depletion regions (for example from a contacted N+ region not shown in FIG. 3), then inversion layers will form within the depletion regions in polycrystalline semiconductor layer 304. Thus, inversion layers 308 and 309 of back gate devices 302 and 303 may serve as the source region and the drain region for the transistor controlled by front gate device 301.

Figure 1:
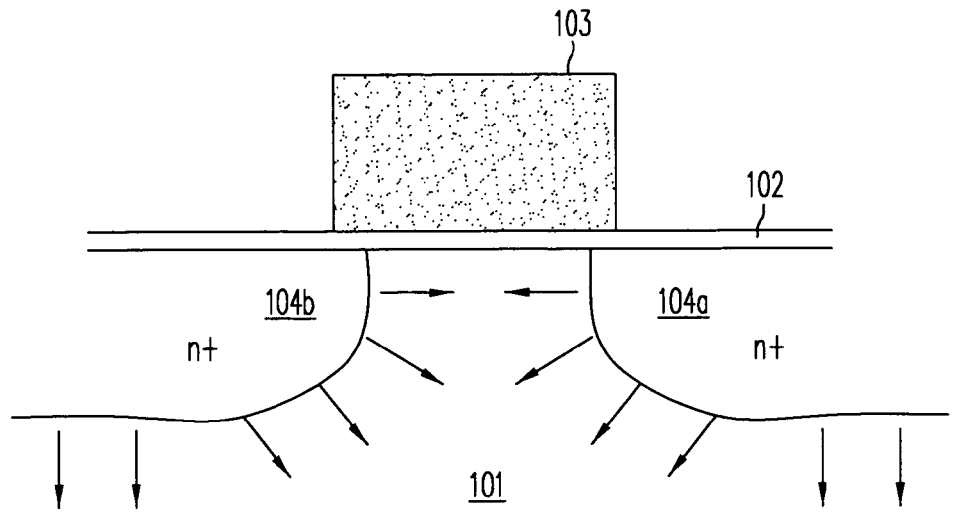
FIG. 1 illustrates dopant diffusion in conventional NMOS field effect transistor 100.
Figure 2:
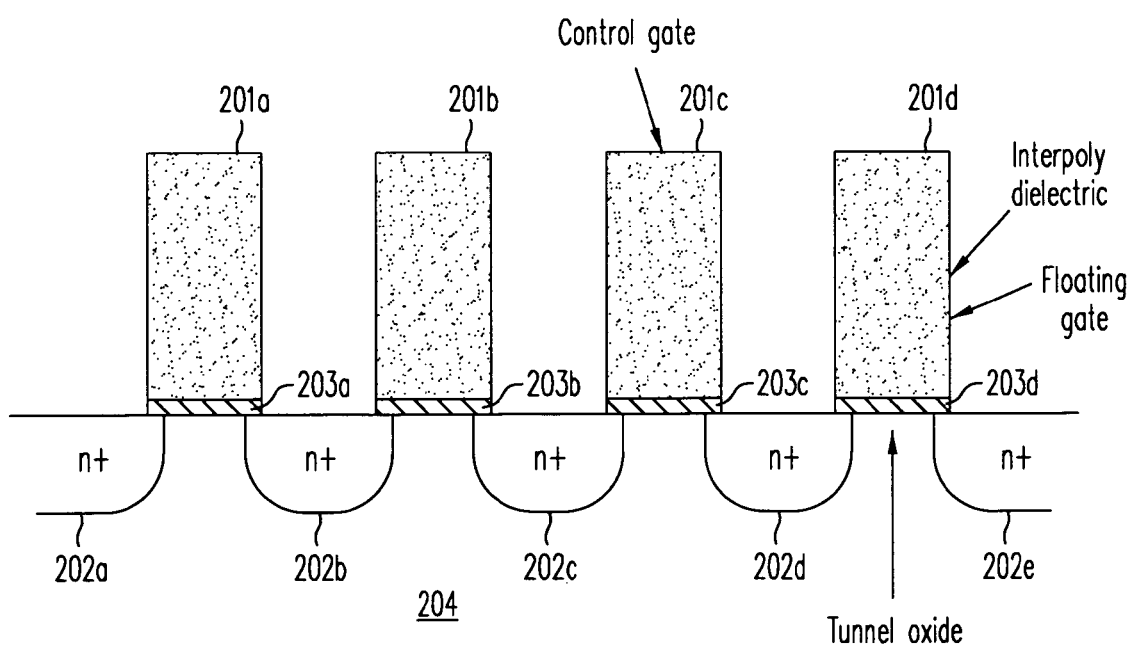
FIG. 2 shows memory transistors 200a-200d in a NAND flash string structure.

The technique of FIG. 3 may be applied to form NAND-type flash memory structures. FIG. 4 shows 4-bit NAND flash string 400 formed out of thin-film transistors (TFTs) in which front gate devices 401-404 are the memory devices and the back gate devices 405-409 are used to form inversion regions to serve as source regions and drain regions, in accordance with one embodiment of the present invention. Front gate devices 401-404 may each have a structure similar to those of memory transistors 200a-200d of FIG. 2. Back gate devices 405-409 may each have a structure similar to back gate devices 302 and 303 of FIG. 3. Polycrystalline semiconductor layer 410 preferably has a thickness less than ~2000 Å in order for back gate inversion layers to link up electrically through depletion regions with a front gate inversion layer. In FIG. 4, N+ regions 413 and 414 are provided at suitable positions in polycrystalline semiconductor layer 410 to provide 4-bit NAND flash string 400 connections to a bit line and a common source line. Further, front gate devices 411 and 412 ("select gates")—in this instance fabricated as memory devices along with memory gates 401-404, but having longer channel lengths than the corresponding channel lengths of transistors 401-404—ensure inversion layers of back gate devices 405 and 409 contact the implanted N+ bit-line contact regions 413 and 414. By selectively "turning on" back gate devices 405-409 (also known as "source/drain gates"), memory gates 401-404 and select gates 411 and 412, the access and programming functions of NAND flash string 400 can be achieved. The lateral extants of the source and drain regions in 4-bit NAND string 400 are controlled through lithographic techniques rather than dopant diffusion.

FIG. 5 shows 4-bit NAND flash string 500, structurally similar to 4-bit NAND flash string 400 of FIG. 4, except that the back gate devices 405-409 are replaced by common gate 501, in accordance with another embodiment of the present invention. Along the length of common gate 501 is provided gate dielectric regions 503a-503e of suitable thickness between common gate 501 and polycrystalline semiconductor region 510. When a suitable voltage is imposed on common gate 501, inversion layers are formed opposite gate dielectric regions 503a-503e to act as source regions and drain regions to connect the inversion layers of selected memory devices 401-404. The portions of common gate 501 opposite memory devices 401-404 and select gates 411 and 412 are provided respective relatively thick gate dielectric regions 502a-502g to minimize any inversion layers formed opposite memory devices 401-404 by the voltage on common gate 501.

FIG. 6 shows 9-bit NAND flash string 600, in accordance with another embodiment of the present invention. 9-bit NAND flash string 600 has a structure similar to 4-bit NAND flash string 400 of FIG. 4, except that source/drain gates 405-409 are replaced by memory devices 505-509. Thus, 9-bit NAND flash string 600 achieves about twice the memory capacity over substantially the same lateral dimensions, while retaining the advantages of being independent of dopant diffusion, The above detailed description is provided to illustrate specific embodiments of the present invention and is not intended to be limiting. Numerous variations and modifications within the scope of the present invention are possible. The present invention is set forth in the following claims.

I claim:

1. A semiconductor device, comprising:
a semiconductor layer;
a first control gate electrically isolated from a first surface of the semiconductor layer by a first dielectric layer, wherein a first voltage applied on the first control gate forms a first depletion region in the semiconductor layer opposite the first control gate, and
a second control gate and a third control gate each isolated from the semiconductor region by a second dielectric layer formed on a second surface of the semiconductor layer opposite the first surface, wherein the second and third control gates are offset from the first control gate such that, when a second voltage is applied to the second and third control gates, depletion regions are formed opposite the second and third control gates, respectively, such that each of the depletion regions opposite the second and third control gates overlaps the first depletion region;
wherein the semiconductor device is provided adjacent a second semiconductor device configured substantially the same as the semiconductor device, and wherein the depletion region of the second control gate overlaps the depletion region of the first control gate of the second semiconductor device.

2. A semiconductor Device as in claim 1, wherein the semiconductor region comprises polycrystalline silicon.

3. A semiconductor Device as in claim 2, wherein the polycrystalline silicon comprises polysilicon.

4. A semiconductor Device as in claim 2, wherein the polycrystalline silicon comprises amorphous silicon.

5. A semiconductor Device as in claim 1, wherein the first control gate is provided in a non-volatile memory device.

6. A semiconductor Device as in claim 1, wherein the second control gate is provided in a non-volatile memory device.

7. A semiconductor Device as in claim 5, wherein the non-volatile memory device is one of a plurality of non-volatile memory devices formed along the first surface of the semiconductor layer.

8. A semiconductor Device as in claim 7, wherein the second and the third control gates are each one of a plurality of source/drain gates formed along the second surface of the semiconductor layer, wherein the non-volatile memory devices and the source/drain gates form a NAND flash string.

9. A method for creating a semiconductor device, comprising:
providing a semiconductor layer;
providing a first control gate electrically isolated from a first surface of the semiconductor layer by a first dielectric layer, wherein a first voltage applied on the first control gate forms a first depletion region in the semiconductor layer opposite the first control gate; and
providing a second control gate and a third control gate each isolated from the semiconductor region by a second dielectric layer formed on a second surface of the semiconductor layer opposite the first surface, wherein the second and third control gates are offset from the first control gate such that, when a second voltage is applied to the second and third control gates, depletion regions are formed opposite the second and third control gates, respectively, such that each of the depletion regions opposite the second and third control gates overlaps the first depletion region;
wherein the semiconductor device is provided adjacent a second semiconductor device configured substantially the same as the semiconductor device, and wherein the depletion region of the second control gate overlaps the depletion region of the first control gate of the second semiconductor device.

10. A method as in claim 9, wherein the semiconductor region comprises polycrystalline silicon.

11. A method as in claim 10, wherein the polycrystalline silicon comprises polysilicon.

12. A method as in claim 10, wherein the polycrystalline silicon comprises amorphous silicon.

13. A method as in claim 9, wherein the first control gate is provided in a non-volatile memory device.

14. A method as in claim 9, wherein the second control gate is provided in a non-volatile memory device.

15. A method as in claim 14, wherein the non-volatile memory device is provided as one of a plurality of non-volatile memory devices formed along the first surface of the semiconductor layer.

16. A method as in claim 15, wherein the second and the third control gates are each provided as one of a plurality of source/drain gates formed along the second surface of the semiconductor layer, wherein the non-volatile memory devices and the source/drain gates form a NAND flash string.

17. A semiconductor device as in claim 8, wherein the NAND flash string comprises heavily doped regions formed in the semiconductor layer at the ends of the NAND flash string.

18. A semiconductor device as in claim 17, wherein source/drain gates adjacent the heavily doped regions are longer than other source/drain gates in the NAND flash string.

19. A semiconductor device as in claim 17, wherein the first control gate of each non-volatile memory device of the NAND flash string adjacent the heavily doped regions are longer than the first control gates of other non-volatile devices of the NAND flash string.

20. A method as in claim 16, wherein the NAND flash string comprises heavily doped regions formed in the semiconductor layer at the ends of the NAND flash string.

21. A method as in claim 20, wherein source/drain gates adjacent the heavily doped regions are longer than other source/drain gates in the NAND flash string.

22. A method as in claim 20, wherein the first control gate of each non-volatile memory device of the NAND flash string adjacent the heavily doped regions are longer than the first control gates of other non-volatile devices of the NAND flash string.

* * * * *